United States Patent [19]
Louagie et al.

[11] Patent Number: 6,157,333
[45] Date of Patent: Dec. 5, 2000

[54] METHOD FOR SELECTING A SEQUENCE OF CELLS INSIDE A BIDIMENSIONAL MATRIX STRUCTURE OF A DIGITAL-ANALOG CONVERTER AND CORRESPONDING CONVERTER

[75] Inventors: Filip Marcel Louagie, Dadizele; Zhong Yuan Chang, Antwerp; Jean-Philippe Robert Adiel Cornil, Edingen, all of Belgium

[73] Assignee: Alcatel, Paris, France

[21] Appl. No.: 09/153,983

[22] Filed: Sep. 16, 1998

[30] Foreign Application Priority Data

Sep. 19, 1997 [EP] European Pat. Off. .............. 97402193

[51] Int. Cl.$^7$ .................................................. H03M 1/00
[52] U.S. Cl. ............................. 341/144; 341/133
[58] Field of Search .................... 341/144, 145, 341/150, 153, 154, 148, 133

[56] References Cited

U.S. PATENT DOCUMENTS

| | | | |
|---|---|---|---|
| 3,995,304 | 11/1976 | Pease | 341/144 |
| 4,658,240 | 4/1987 | Bixby | 341/144 |
| 4,695,826 | 9/1987 | Ando et al. | 341/144 |
| 4,859,930 | 8/1989 | Schouwenaars et al. | 323/317 |
| 5,057,838 | 10/1991 | Tsuji et al. | 341/133 |
| 5,977,897 | 11/1999 | Barnes et al. | 341/144 |

OTHER PUBLICATIONS

"A 10–B 70–MS/S CMOS D/A Converter" by Yasuyuki Nakamura et al, IEEE Journal of Solid State Circuits, vol. 26, No. 4, Apr. 1, 1991, pp. 637–642.

"A Module Generator for High Speed CMOS Current Output Digital/Analog Converters" Proceedings of the Custom Integrated Circuits Conf. Santa Clara, 5/1 0 5/4 1995.

Patent Abstracts of Japan, vol. 018, No. 026 (E–1491), Jan. 14, 1994 & JP 05 259915 A (Matsushita Electric IND CO LTD) Oct. 8, 1993 Abstract.

*Primary Examiner*—Peguy JeanPierre
*Attorney, Agent, or Firm*—Ware, Fressola, Van Der Sluys & Adolphson LLP

[57] ABSTRACT

The invention relates to a method for selecting a sequence of cells of current sources inside a cell matrix structure of a digital-analog converter and also to the corresponding converter. Symmetries are used with regard to the centre (C) of a rectangular or preferably square matrix structure, with regard to a symmetry point (S) located at a quarter of the length of a diagonal (D1) from the centre and with regard to one of the two mean perpendiculars (M1) of the structure for selecting the mapping areas (1, 2, . . . ) for the consecutive cells.

3 Claims, 1 Drawing Sheet

METHOD FOR SELECTING A SEQUENCE OF CELLS INSIDE A BIDIMENSIONAL MATRIX STRUCTURE OF A DIGITAL-ANALOG CONVERTER AND CORRESPONDING CONVERTER

BACKGROUND OF THE INVENTION

1. Field of the Invention

The present invention relates to a method for selecting a sequence of cells of current sources inside a cell matrix structure of a digital-analog converter.

2. Background of the Invention

There is a need for fast and accurate digital-analog converters, for instance in high-definition video systems.

Known digital-analog, or D/A, converters are based on matrixes of cells of current sources and for instance of CMOS sources. Usually each cell corresponds to a current source and the final output from a D/A converter is obtained by summing the respective outputs of the current sources selectively addressed. The current sources to be switched on are selected on the basis of an inputted digital value and according to a method chosen for providing a high level of linearity to the D/A converter.

As pointed out for instance in an article entitled "A 10-b 70-MS/s CMOS D/A Converter" published in the *IEEE JOURNAL OF SOLID-STATE CIRCUITS*, vol. 26, N° 4, APRIL 1991, pages 637–642 by Yasuyuki NAKAMURA & al, an integral linearity error is caused by error distribution of current sources and a method for reducing such an error is based on so-called "hierarchical symmetrical switching". As mentioned in the above cited article, graded errors are induced by voltage drops along the power supply lines of the sources in a D/A converter chip and symmetrical errors are induced by thermal distribution inside the chip.

The hierarchical symmetrical switching foreseen in the cited article, is based on a selection of sources row by row according to the analog value to be outputted and symmetrically for a given row with regard to the middle of this given row. However if a mismatching compensation is obtained for the sources according to the rows of a matrix, there is no compensation of symmetrical errors foreseen for the sources according to the columns.

Using hierarchical symmetrical switching in two dimensions instead of one is foreseeable. however a straightforward implementation of it results in a complex decoding logic associated with a complex routing and consequently to an oversized matrix area. Furthermore there is a degradation of the converting speed when compared with the speed of an arrangement in one dimension as foreseen above.

SUMMARY OF THE INVENTION

The main object of the present invention is to provide a method for selecting a sequence of cells of current sources inside a bidimensional matrix structure of a digital-analog converter wherein a variable number of said sources is switched on according to the value of an inputted digital signal and wherein a corresponding analog output signal is obtained by summing up the respective outputs of the sources which are switched on, said matrix structure, considered as rectangular or preferably square, including side to side and identical mapping areas, with each of said areas being attributed to a cell and with each cell including a same number of at least one current source.

According to the invention, the method includes the following steps:

a first step for selecting two neighbor areas along a first diagonal of the structure for a first and second cells on each side of a symmetry point located at a quarter of the diagonal length from the centre of the rectangular or square structure and a pair of areas, respectively symmetrical of the first and second areas with regard to the centre on the first diagonal, for a third and fourth cells, a second step for selecting four areas symmetrical, from the four areas selected by means of the preceding first step, with regard with a first of the two mean perpendicular, for the four following cells, a third step for selecting a first of successive and yet unselected areas, lined in a first area strip portion between the said first area and the other mean perpendicular of the rectangular structure, as a so-called primary area for a further selection of a so-called secondary area symmetrical of this primary area with regard to the symmetry point and of a pair of areas respectively symmetrical of these primary and secondary areas with regard to the centre, the auxiliary area neighboring the first area being selected for the ninth cell, the corresponding secondary area for the tenth cell and their respective symmetrical areas with regard to the centre for the eleventh and twelfth cells a fourth step for selecting four areas symmetrical, from the four areas selected by means of the preceding third step, with regard to the first mean perpendicular, for the four following cells, a fifth step for repeating the third and fourth steps for successively each of the yet unselected areas located in the first area strip portion after the primary area(s) already selected, each time for eight successive cells, a sixth step for implementing the fifth step for each of the areas of a second area strip portion parallel to and neighbor of the first area strip portion in a zone limited by the said other mean perpendicular and a parallel passing through the symmetry point, in relation with a corresponding sequence of cells, a seventh step for repeating, as long as necessary, the sixth step for each area strip portion, located in the zone and in parallel with the first mapping area strip portion, with a side alternation from one area strip portion to the following one, and in relation with a corresponding sequence of cells.

Another object of the invention is to provide a digital-analog converter including a bidimensional matrix structure of cells of current sources wherein a variable number of current sources distributed among the cells is switched on according to the value of an inputted digital signal and wherein a corresponding analog output signal is obtained by summing up the respective outputs of the current sources which are switched on. According to the invention, the converter includes row and column decoding means associated by means of column and row control links with a matrix structure of cells having their respective areas distributed according to the method as defined above.

According to another characteristic of the invention, the converter comprises a bidimensional matrix structure of cells with only one current source each, said converter comprising a control link for every column (or row) of cells of according to one dimension and four control links for every row or (column) according to the other dimension of the matrix structure.

BRIEF DESCRIPTION OF THE DRAWINGS

These and other objects, advantages and features of the invention will become apparent from the following description thereof taken in conjunction with the accompanying drawings which illustrate a specific embodiment of the present invention.

DESCRIPTION OF THE PREFERRED EMBODIMENT

Figure 1:
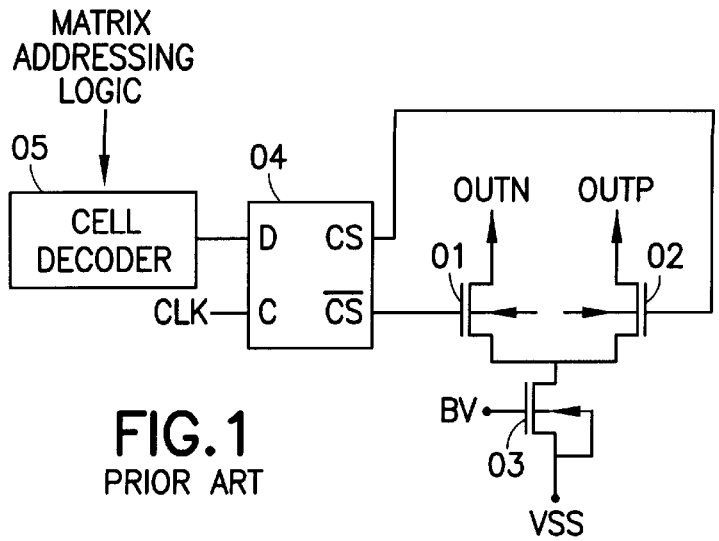
FIG. 1 is a layout of a known example of a cell with an associated decoding logic for a matrix structure of a digital-analog converter.

FIG. 1 shows an example chosen among others of a cell for a bidimensional matrix structure of a digital-analog converter.

According to this known layout of a cell with only one current source, a switching element is associated with this current source, however use of a different number of sources by cell is also foreseeable and needs to be taken in account. The switching element illustrated on FIG. 1 comprises two mirrored transistors 01 and 02 connected in parallel and the current source comprises a third transistor 03. The sources of transistors 01 and 02 are connected to the drain of transistor 03, this last having its own drain connected to a substrate ground link VSS of the matrix component. The drains of transistors 01 and 02 are respectively to output terminals OUTN and OUTP. Complementary control signals CS and $\overline{CS}$ are applied to the gates of transistors 01 and 02 and a bias voltage BV is applied to the gate of transistor 03. The bias voltage BV is common to all cells of the matrix structure, it controls the value of the current fed by transistor 03 in the cell to which this transistor belongs. Control signals CS and $\overline{CS}$ are provided by a bistable trigger 04 having a data input D connected to an output of a cell decoder OS and a clock input C receiving a clock signal CLK common for all the cells in the converter. The cell decoder OS receives row and column controls from a matrix addressing logic for switching on the current source when required. As already known the matrix addressing logic when receiving a digital signal converts such a signal in row and column controls for switching on a number of current sources depending on the digital value of the received signal. As all the source output terminals OUTN and all the source output terminals OUTP are respectively connected together it is provided on a converter output terminal OUTN an analog signal summing up the currents provided by the output terminals OUTN of all the sources then switched on. In the same way there is also an analog signal at a converter output terminal OUTP summing up the currents provided by the output terminals OUTP of all the sources then switched on.

As reminded above, graded and symmetrical errors originating from mismatched sources are avoided with a hierarchical symmetrical layout of the sources according to one dimension in a matrix structure. But graded and symmetrical errors remain according to the other dimension of the matrix.

Figure 2:
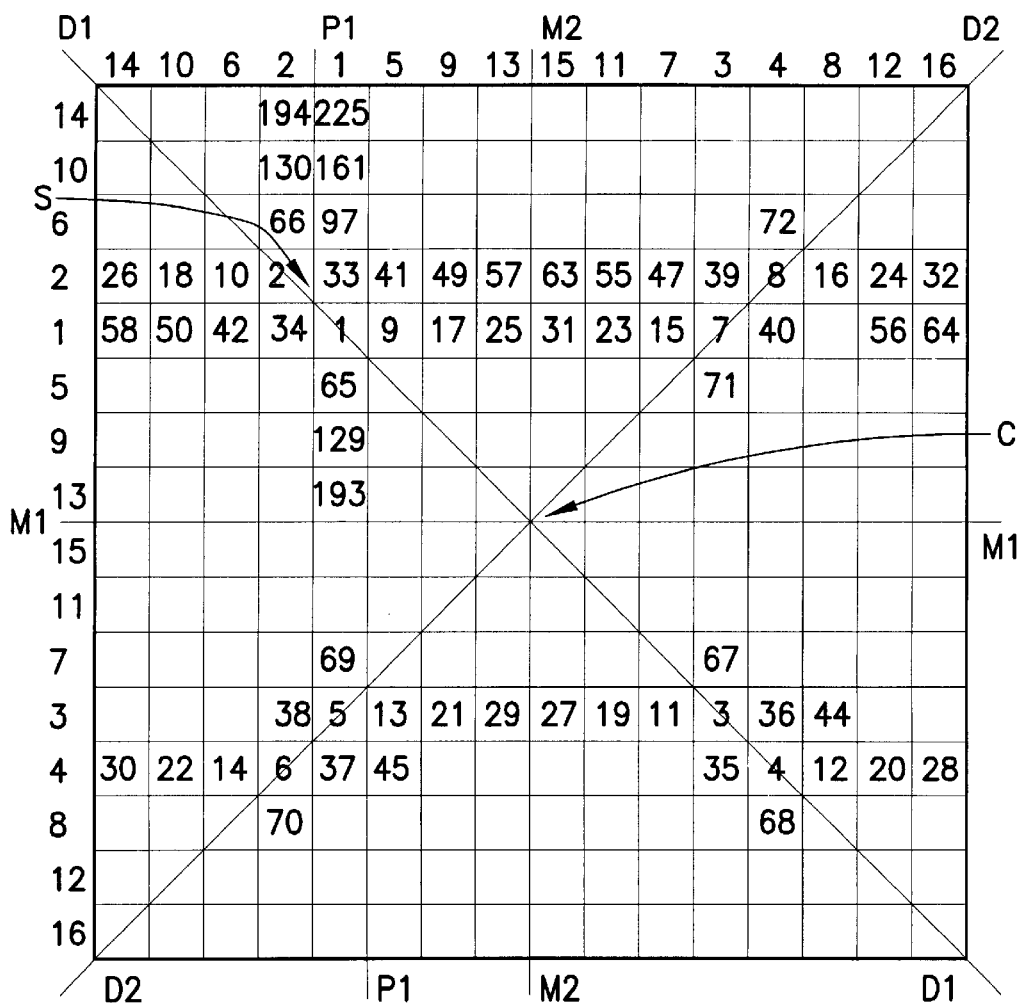
FIG. 2 is an example of a selecting scheme for a sequence of cells inside a bidimensional matrix structure of a digital-analog converter according to the invention.

FIG. 2 illustrates a method for selecting a sequence of cells inside a bidimensional matrix structure according to which such drawbacks are avoided. The bidimensional matrix structure is considered as assimilable at least to a rectangle or preferably to a square shared by a determined number of cells. This determined number is related to the number of sources considered as necessary for obtaining the maximal value of summed current corresponding to the highest imputable digital value for the converters when there is one source by cell as supposed here.

A mapping area corresponds to each cell in the bidimensional matrix structure, they are preferably identical and located side by side. Each area corresponds to a determined row and to a determined column in the matrix structure. It is assumed here that the areas correspond to identical squares, knowing that other shapes such as for instance rectangles could also be taken in account. As an example there are 255 areas for as many cells of one source illustrated on FIG. 2.

An even number of areas by row and even number of areas by column are preferably chosen in the matrix structure as they provide a structure centre such as C with regard to which symmetry rules are applicable.

Four sectors having same size are obtained by division of the matrix structure according to the two mean perpendiculars of the structure sides, such as M1 an M2 on FIG. 2. Each sector is symmetrical to another sector with regard to the centre C of the structure and symmetrical to another sector with regard to every of the two mean perpendiculars MI and M2. Even numbers of areas by columns and by rows in each sector are also preferably chosen and particularly with a same number for the columns and for the rows as in FIG. 2, but such choices are not compulsory.

According to a first selection step, two neighbor areas located along a first diagonal D1 of the structure on each side of a symmetry point S located at a quarter of the diagonal length from the centre C are selected as mapping areas 1, 2 for a first and a second cells of the structure, knowing that such a choice is in relation with the order for controlling the switching on of the sources, when there is only one source by cell.

Accordingly the first area 1, as on FIG. 2, corresponds for instance to the cell of the first source to be switched on as soon as at least one source needs to be switched on and so on for the second and the following cells and their respective sources.

Due to their respective positions with regard to symmetry point S areas 1 and 2 are both situated in a same of the four sectors defined by mean perpendiculars M1 and M2, area 1 is for instance located on a same side of symmetry point S as centre C. Alternatively area I could also be selected on the other side of this symmetry point S.

There is also a selection of a pair of areas 3 and 4, symmetrical of the first and second areas 1 and 2 with regard to the centre C, as mapping areas for a third and fourth cells of the structure. Consequently none of these four consecutive areas 1 to 4 and consequently none of their respectively corresponding cells is on a same row or a same column than the three others.

As these four cells have areas grouped by pair in two sectors, it is provided a similar arrangement of the areas for the four following cells in the two other sectors.

According to a second step, there is a selection of four areas 5, 6, 7; 8 symmetrical of the four areas 1, 2, 3, 4 selected by means of the preceding first step, with regard with one of the two mean perpendicular of the matrix structure, for the four following cells, the chosen mean perpendicular being M1 on FIG. 2. A third step is then used for selecting a first of successive and yet unselected areas lined in a first area strip portion, between the first area selected and a mean perpendicular which is here mean perpendicular M2, as an area for the following cell. So is selected for instance area 9 for the ninth area, with area 9 neighboring area 1 in the area strip portion also including areas referenced 17 and 25. Such an area is called here a primary area and is used for a further selection of a so-called secondary area for the following cell, this secondary area being chosen symmetrical of the previous primary area with regard to symmetry point S. Accordingly area 10 corresponds to a secondary area and is selected for a tenth cell. There is a further selection of a pair of areas symmetrical of a primary area and of a corresponding secondary area with regard to the centre C for the two consecutive and following cells and consequently areas 11 and 12 are selected for the eleventh and twelfth cells.

According to a fourth step, symmetry with regard to the first mean perpendicular M1 provides the four following areas for the four consecutively following cells from the four cells selected according to the preceding third step. Accordingly areas 13 to 16 symmetrical of areas 9 to 12 with regard to mean perpendicular M1 are selected for the cells thirteen to sixteen.

In a repetition of the third step, there is a selection of an area 17 neighbor of area 9 in the above mentioned first area strip portion on the other side of area 1 with regard to area 9. This area 17 is selected for the seventeenth cell and as a new primary area.

In a repetition of the fourth step, there is a selection of the seven following areas 18 to 24, from primary area 17 for the successively following cells in a way identical to selection of areas 10 to 16 from primary area 9 for the corresponding cells.

Such a repetition of the third and fourth steps is continued as a fifth step for successively each of the yet unselected areas located in the first area strip portion and accordingly for an area 25 on FIG. 2.

As soon all the areas of the first cell strip portion are selected as well as the areas obtained from them, a sixth selection step, similar to the one provided from the areas of the first area strip portion, is used for a second area strip portion also included in a zone limited by the second mean perpendicular (M2) and a parallel (P1) passing through the symmetry point (S).

In FIG. 2, this second area strip portion is a neighbor and a parallel to the first area strip portion. It is also located on the other side of the first area strip portion with regard to centre C. It comprises successive areas 33, 41, 49, 57 selected in the same way as areas 17, 25 and used as primary areas in the same way.

As soon as all the areas of the second area strip portion are selected as well as the areas obtained from them, a seventh step repeating the preceding step is used for every area strip portion located in parallel to the first area strip portion in the zone limited by the first mean perpendicular (M2), the parallel (P1), the mean perpendicular M1 and the edge of the structure on the same side of mean perpendicular M1 than symmetry point S, as long as remains an area strip portion in the zone with areas still unselected.

According to the seventh step, there is a side alternation from one area strip portion to the following one with regard to the first area strip portion. Accordingly the area strip portion including area 65 is chosen parallel to and neighbor with first area strip portion including areas 1, 9, 17, 25 on the side of centre C. The following area strip portion including area 97 is chosen on the other side of first area strip portion in parallel to and neighbor with the so called second area strip portion.

The side alternation could have been started in the other way on the inside of first area strip portion in the structure for the second area strip portion and with a further side alternation as indicated above. In a similar way areas 1 and 2 could have been inverted with area 1 on the other side of symmetry point S with regard to centre C and consequently with an inversion for the two areas of each pair in the structure.

FIG. 2 also illustrates the row and column distribution outside of the matrix structure in relation with the control inputs for each row and column.

Due to the mapping areas, or cells, distribution linked with the positioning of the area strip portions, two rows respectively including areas 1 and 2. are neighbours of symmetry point S on each side of it and in parallel with mean perpendicular M1. Two columns respectively also including areas 1 and 2 are neighbours of symmetry point S on each side of it and in parallel with mean perpendicular M2.

Rows referenced 3, 4 on FIG. 2 and respectively including areas 3 and 4 are respectively symmetrical to rows referenced 1 and 2 including areas 1 and 2 with regard to mean perpendicular M1. The same thing happens for the columns referenced 3, 4 including areas 3, 4 and columns referenced 1, 2 including areas 1, 2 with regard to mean perpendicular M2.

Taking in consideration the area strip portions, it is pointed out that first and second area strip portions correspond respectively to rows referenced 1, 2 and rows respectively referenced 5, 6, 9, 10 13, 14 correspond to the alternated area strip portions obtained by side alternation with regard to first area strip portion in the sector including the symmetry point S of the matrix structure.

The order of the rows referenced 3, 4, 7, 8, 11, 12, 15, 16 is obtained by symmetry with regard to mean perpendicular MI from the order of the rows referenced 1, 2, 5, 6, 9, 10 13, 14 on FIG. 2. A similar arrangement is made for the columns referenced 1 to 16.

As according to the symmetry of the mapping arrangement, the consecutive cells are distributed by group of four consecutive cells, with each of the four cells of a group having an area located on a different row and on a different column with regard to the three areas corresponding to the three other cells.

The cells included in the matrix structure are switched under control or a row decoder and of a column decoder.

According to the invention, there is provided one control link for each row of the matrix structure and four control links are provided for each column and the rows are activated four by four, so a very simple row decoder is required.

However four cells on a same column such as for instance 1, 5, 33, 37 are selected according to the simultaneous row selection of the corresponding row control links, i.e. 1, 2, 3, 4 on FIG. 2. Accordingly selection of a cell among four in a column requires four different column control links, every column control links being common to four different cells of the same column, such as for instance cells 1, 65, 129, 193 or cells 2, 66, 130, 194.

As clearly noticeable on FIG. 2. the four cells sharing a same column control link are in fact in line side by side and the corresponding control link does not need to be long. If the column decoder is more complex than a column decoder with only one control link by column as in the known prior art, it is not in fact very complex.

Only a very simple row decoder is necessary as for instance there is only four row control links required with the square matrix structure comprising sixteen rows and sixteen columns as illustrated on FIG. 2, each row control link activating simultaneously four rows.

Such an arrangement reduces the number of conductive tracks associated to the matrix structure, simplifies the decoding arrangement required for the selection of the cells to be switched on when the converter is in use and facilitates the routing in the matrix structure, such a routing becoming very limited.

As easily understood a similar arrangement with one column control link by column and four row control links by row, i.e. a control link for each line according to one dimension of the matrix and four control links for each line according to the other dimension, is also foreseeable.

What is claimed is:

1. A method for selecting a sequence of cells including current sources inside a cell matrix bidimensional structure of a digital-analog converter wherein a variable number of current sources are switched on according to the value of an inputted digital signal and wherein a corresponding analog output signal is obtained by summing the respective outputs of the sources which are switched on, said bidimensional structure, considered as rectangular or preferably square, said bidimensional structure having first and second mean perpendiculars (M1, M2) and first and second diagonals (D1, D2), said bidimensional structure further including side to side and identical mapping areas for the cells, with each of said areas being attributed to a cell and with each cell including a same number of at least one current source, characterized in that it includes the following steps:

a first step for selecting first and second areas (1,2) along a first diagonal (D1) of the structure respectively for a first and second cells on each side of a symmetry pint (S) located at a quarter of the diagonal length and away from the centre (C) of the rectangular or square structure and a pair of areas (3,4), respectively symmetrical of the first and second areas with regard to the centre (C) on the first diagonal, for a third and fourth cells, a second step for selecting four areas (5 to 8) symmetrical of the four areas selected by means of the preceding first step, with regard to the first mean perpendicular (M1), for the first, second, third and fourth cells, a third step for selecting a first of successive and yet unselected area (9,17,25) as a primary area (9), lined in a first area strip portion located between the said first area (1) and the other mean perpendicular (M2) of the rectangular structure, so that a further selection of a secondary area (10) is subsequently performed, said secondary area being symmetrical of this primary area (9) with regard to the symmetry point (S), so that a pair of areas (11,12) is selected as located symmetrical of these primary and secondary areas with regard to the centre (C), the primary area (9) neighboring the first area (1) being selected for the ninth cell, the corresponding secondary area (10) for the tenth cell and their respective symmetrical area (11, 12) with regard to centre (C) for the eleventh and twelfth cells, a fourth step for selecting four areas (13 to 16) symmetrical, from the four areas selected by means of the preceding third step, with regard to the first mean perpendicular (M1), for the ninth, tenth, eleventh and twelfth cells, a fifth step for repeating the third and fourth steps for successively each of the yet unselected areas located in the first area strip portion after the primary area(s) already selected, each time for eight successive cells, a sixth step for implementing the fifth step for each of the areas of a second area strip portion parallel to and neighbor of the first area strip portion in a zone limited by the said other mean perpendicular (M2) and a parallel (P1) passing through the symmetry point (S), in relation with a corresponding sequence of cells, a seventh step for repeating the sixth step, for each area strip portion, located in the zone and in parallel with the first area strip portion, with a side alternation from one area strip portion to the following one, and again in relation with a corresponding sequence of cells.

2. A digital-analog converter including a bidimensional matrix structure of cells wherein a variable number of current sources included in the cells is switched on according to the value of an inputted digital signal and wherein a corresponding analog output signal is obtained by summing up the respective outputs of the sources which are switched on, characterised in that it includes row and column decoding means associated by means of column and row control links with a matrix structure of areas distributed according to claim 1.

3. A digital-analog converter according to claim 2, characterised in that it comprises a bidimensional matrix structure made of cells with only one source each and with a control link for every column (or row) of cells according to one dimension and four control links for every row or (column) according to the other dimension of the matrix structure.

* * * * *

UNITED STATES PATENT AND TRADEMARK OFFICE
CERTIFICATE OF CORRECTION

PATENT NO. : 6,157,333
DATED : December 5, 2000
INVENTOR(S) : Filip Marcel Louagie, Zhong Yuan Chang, and Jean-Philippe Robert Adiel Cornil It is certified that error appears in the above-identified patent and that said Letters Patent is hereby corrected as shown below:

Column 7,
Line 24 (claim 1, line 18), "pint" should be -- point --.
Line 33 (claim 1, line 27), "first, second, third and fourth" should be -- fifth, sixth, seventh and eighth --.

Column 8,
Lines 8-9 (claim 1, lines 46-47), "ninth, tenth, eleventh and twelfth" should be -- thirteenth, fourteenth, fifteenth and sixteenth --.
Lines 39-40 (claim 3, lines 5-6), "or (column)" should be -- (or column) --.

Signed and Sealed this

Thirtieth Day of October, 2001

Attest:

NICHOLAS P. GODICI
*Attesting Officer*     *Acting Director of the United States Patent and Trademark Office*